May 16, 1961 P. E. RENSHAW ET AL 2,984,413

HIGH SPEED ELECTRIC PULSE COUNTER AND RELAY MECHANISM

Filed Sept. 18, 1957 6 Sheets-Sheet 1

INVENTORS
PHILIP E. RENSHAW
STEWART D. BARGER
CARL B. CRUMB, JR.
By:
Mellin and Hanscom
Attorneys

HIGH SPEED ELECTRIC PULSE COUNTER AND RELAY MECHANISM

Filed Sept. 18, 1957 6 Sheets-Sheet 2

INVENTORS
PHILIP E. RENSHAW
STEWART D. BARGER
CARL B. CRUMB, JR.
By:
Mellin and Hanscom
Attorneys INVENTORS
PHILIP E. RENSHAW
STEWART D. BARGER
CARL B. CRUMB, JR.
By:
Mellin and Hanscom
Attorneys

HIGH SPEED ELECTRIC PULSE COUNTER AND RELAY MECHANISM

INVENTORS
PHILIP E. RENSHAW
STEWART D. BARGER
CARL B. CRUMB, JR.
By:
Mellin and Hanscom
Attorneys

HIGH SPEED ELECTRIC PULSE COUNTER AND RELAY MECHANISM

Filed Sept. 18, 1957 6 Sheets-Sheet 5

INVENTORS
PHILIP E. RENSHAW
STEWART D. BARGER
CARL B. CRUMB, JR.
By:
Mellin and Hanscom
Attorneys

HIGH SPEED ELECTRIC PULSE COUNTER AND RELAY MECHANISM

Filed Sept. 18, 1957 6 Sheets-Sheet 6

INVENTORS
PHILIP E. RENSHAW
STEWART D. BARGER
CARL B. CRUMB, JR.
By:
Mellin and Hanscom
Attorneys United States Patent Office 2,984,413
Patented May 16, 1961

2,984,413

HIGH SPEED ELECTRIC PULSE COUNTER AND RELAY MECHANISM

Philip E. Renshaw and Stewart D. Barger, Seattle, Wash., and Carl B. Crumb, Jr., Southfield Township, Oakland County, Mich., assignors to Tally Register Corporation, Seattle, Wash., a corporation of Washington Filed Sept. 18, 1957, Ser. No. 684,695

18 Claims. (Cl. 235—92)

This invention relates to electromechanical mechanisms adapted to sense at high speed a succession of like pulses whether in a continuous or intermittent series and to produce control energization or signals periodically in response to the sensing of predetermined groups of such pulses. In addition, the invention relates to relay mechanisms adapted to perform switching functions when energized by such pulses. This application is a continuation-in-part application of our copending application, Serial No. 420,952, filed April 5, 1954, and now abandoned.

A principal object of this invention is to provide an electromechanical pulse counter adapted to receive a series of high speed continuous or intermittent pulses and to actuate switching mechanisms after a predetermined number of pulses has been received.

A further object of the invention is to provide an electromechanical pulse relay adapted to be energized by pulses to perform switching operations and in which the switching operation occurs after the time required to energize the relay.

Another object of the invention is to provide an electromechanical pulse relay and pulse generator in which the pulse generator energizes the relay to perform a switching operation, and in which the pulse generator is also connected with the switches controlled by the relay, the switching operation being delayed until after the pulse has ended so that the switching operation will not occur when the switch circuit is energized.

A yet further object of the invention is to provide a pulse operated relay having a movable member provided with ratchet teeth, a pulse operated means engageable with the ratchet teeth to restrain movement of said movable member, and operable when energized to release the movable member for movement, a switching mechanism operable by movement of the movable member, and in which the switching operation is delayed until after the termination of the pulse required to energize the pulse operated means.

Another object of the invention is to provide a relay as set forth in the last object with latch means to latch the switching mechanism in its actuated position and in which separate pulse operated means are provided to release the latch means.

A still further object of the invention is to provide a pulse generator for the relays as set forth in the last two objects, in which the pulse generator provides an energizing pulse for the ratchet teeth engaging pulse operated means, the pulse being of a time sufficient to energize the pulse operated means and ending before the switching operation occurs, and in which the pulse generating means is connected in series with the switching mechanism.

Other objects and advantages will become apparent in the course of the following detailed description.

In the drawings, forming a portion of this application, and in which like parts are indicated by like reference numerals throughout the same, Fig. 1 is a front elevational view of a pulse counter constructed in accordance with this invention, and with portions shown in section.

Figure 1:
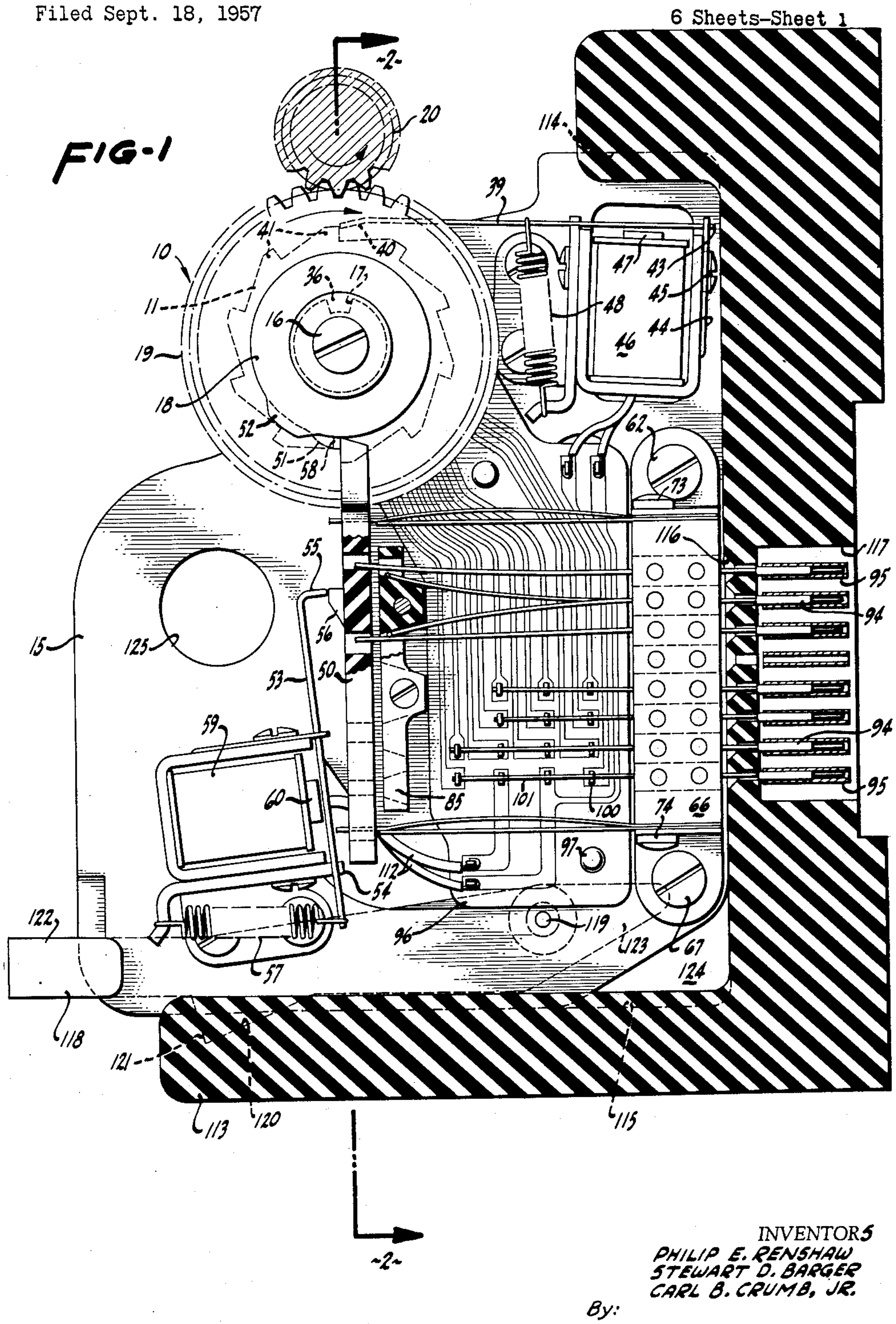

Referring now to the drawings, Figs. 1 thorugh 7 illustrate a pulse counter, constructed in accordance with the invention, and designated generally by the reference numeral 10.

Escapement wheel 11 having an axially extending hub 12 is mounted on sleeve 13 for rotation about a fixed axle 14 secured to the unit supporting plate 15. Bolt 16 is threaded into the end of axle 14, so as to allow the sleeve 13 to rotate freely on the axle while yet preventing the sleeve from riding off the end of the axle.

A keyway 17 is provided in the escapement wheel hub 12, and a cam wheel 18 is mounted on the end of the escapement wheel hub 12, the cam wheel 18 having a radially and inwardly extending projection adapted to fit within the escapement wheel keyway 17 to lock the cam wheel 18 and ratchet wheel 11 against relative rotation. A main drive gear 19, adapted to be driven by the pinion gear 20, is mounted on the escapement wheel hub 12 for free rotative movement thereon.

Figure 12:
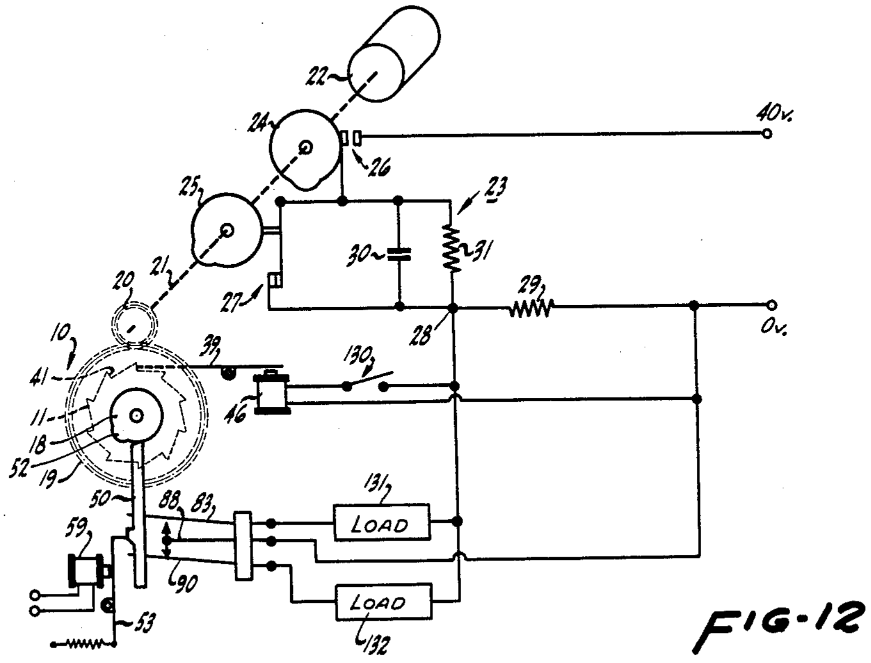
Fig. 12 is a schematic view of the pulse counter shown in Figs. 1–7, illustrating the mechanical and electrical connections thereof to a power drive source and a pulse generator.

As shown in the schematic illustration of Fig. 12, the main drive gear 19 is adapted to be driven by pinion gear 20 meshing therewith, the pinion gear being mounted on shaft 21 and continuously driven by motor 22.

A pluse generator, indicated generally by reference numeral 23, comprises a pair of cams 24 and 25 fixed to shaft 21 and rotatable therewith. For each complete revolution of shaft 21, a single electrical pulse of a discrete time duration will be produced, in the following manner. Rotation of the shaft 21 will cause cam 24 to first close the normally open switch 26 completing a circuit from the 40 volt source through the normally closed switch 27 to the output terminal 28, the 40 volts thus appearing across load resistor 29, the other side of which is connected to a zero volt source. Continued rotation of shaft 11 will then cause cam 25 to open switch 27 thereby interrupting the circuit from the 40 volt source to terminal 28, and thus ending the pulse. For any given speed of rotation of shaft 21, the time duration of the generated pulse may be varied as desired by adjusting the make and break cams 24 and 25 on shaft 11 so that switches 26 and 27 will both be closed for the desired length of time. A capacitor 30 and resistor 31 provide a conventional spark suppressor for the circuit breaking contacts of switch 27.

The pinion gear 20 and drive gear 19 have a gear ratio such that ten revolutions of the drive shaft 21 will rotate the drive gear through one complete revolution, and, thus, for each complete revolution of the drive gear 19, ten electrical pulses will be generated by the pulse generator 23, or, otherwise stated, the escapemnet wheel will rotate through one-tenth of a rotation, or a single tooth advance, for each pulse generated by the pulse generator 23. As is obvious, the speed of rotation of the shaft 11 may be varied without altering the synchronism of the pulse generation with the rotation of the main drive gear 19.

The pulse generator 23, shown herein, is merely an exemplification of a pulse generator that might be used with the pulse counter 10 to produce a series of pulses of a discrete time length and with each pulse being spaced apart in time equal to the length of time it takes the escapement wheel of the counter to rotate through a one tooth advance. Any other pulse generator having these same characteristics may be employed, if desired.

The rotative movement of the drive gear 19 is transmitted to the escapement wheel by a friction disc drive, in which friction discs 32 and 33 are mounted on the escapement wheel hub 12, in a manner similar to the cam wheel 18, the friction discs having formed therewith radially and inwardly extending projections adapted to fit within the keyway 17 formed in the escapement wheel hub 12. Spring washers 34 and 35, keyed to the escapement wheel hub 12 by radially and inwardly extending projections 36, force the friction discs 32 and 33 into engagement with the drive gear 19.

The friction discs 32 and 33 are held against rotation relative to the spring washers 34 by means of embossed ridges 37 formed on the surface of the friction discs, these ridges 37 being formed in pairs so as to receive the arms of the spring washers therebetween and thus the ridges hold the spring washers against relative rotational movement.

From the foregoing, it will be apparent that if the escapement wheel 11 is free to rotate, a rotational motion of the drive gear 19 will be transmitted by the friction discs 32 and 33 to the escapement wheel hub 12, and the escapement wheel 11, cam wheel 18, spring washers 34 and 35 and the friction discs 32 and 33 will all rotate as a unit. If the escapement wheel 11 is held against rotation, the drive gear 19 will rotate about the escapement wheel hub 12 and will merely rub against the friction discs without transmitting any rotational motion thereto. In this manner the drive gear 19 provides a continously rotating impositive drive to the escapement wheel 11.

A pallet lever 39 is provided to latch the escapement wheel 11 against rotation, one end 40 of the pallet lever being adapted to butt against one of the ten escapement teeth 41 of the escapemnet wheel 11. The pallet lever 39 is pivotally mounted intermediate its ends on the lever support 42, mounted on the unit supporting plate 15, and the end 43 of the pallet lever is held by an adjustable stop plate 44, adjustment being had by means of screw 45. An electromagnet 46, which may be designated as the escapement coil of the assembly, is disposed below the pallet lever, with its pole piece 47 in attracting relation to the pallet lever. As the escapement coil 46 is energized, the pole piece will attract and pivot the pallet lever in a clockwise direction about the pivot support 42 and the end 40 will rise out of engagement with the escapement teeth, thus allowing the escapement wheel to rotate under the drive of the main drive gear 19. When the escapement coil 46 is deenergized, the spring 48 will force the pallet lever back into engagement with the escapement teeth 41. The stop plate 44 will limit the counterclockwise rotation of the pallet lever so that the end 40 of the pallet lever will not travel to the root of the escapement teeth.

Turning again to Fig. 12, the output terminal 28 of the pulse generator 23 is connected through a control switch 130 to escapement coil 46 of the counter so that whenever switch 130 is closed, pulses will be delivered to the escapement coil. The pulse length is adjusted so as to be sufficiently long as to cause the escapement coil to be energized thereby.

If the switch 130 is operated to allow a single pulse to be applied to the escapement coil 46, the escapement coil will be energized to attract and move the pallet lever 39 out of rotation restraining engagement with escapement tooth 41, to allow the escapement wheel 11 to rotate. After the pulse has ended, the escapement coil will be de-energized, allowing the pallet lever to move downwardly into position to engage the next tooth on the escapement wheel and to restrain further rotation thereof. Since there are ten escapement teeth on the escapement wheel, it will be seen that the single pulse has allowed the escapement wheel to rotate through a single tooth advance, or 36°.

The synchronization of the pulses generated by the pulse generator 23 to the rotation of the escapement wheel 11 has a distinct advantage. For example, suppose that switch 130 were closed to allow a series of consecutive pulses to energize the escapement coil 46. The first pulse would energize the escapement coil to cause the release of the pallet lever from engagement with the escapement tooth 41, as above described, with the pallet lever returning to stopping position after the pulse ends. However, the second pulse will again energize the escapement coil to swing the pallet lever out of the way of the escapement teeth before the next tooth reaches it, and will thus allow the escapement wheel to continue its rotation, without interruption. Similarly, the third, fourth and fifth pulses will move the pallet lever out of stopping position so that the escapement wheel may freely rotate. After the fifth pulse, the pallet lever will remain in position to engage the next tooth, to stop further rotation of the escapement wheel.

Thus, it can be seen that the escapement wheel will rotate through 36° for each pulse applied to the escapement coil 46, and the only time that the pallet lever re-engages the escapement teeth is after the final pulse of the series. This has a distinct advantage in that the wear on the parts is reduced to a minimum.

Further closing of switch 130 will again cause pulses to be applied to the escapement coil and will again cause the escapement wheel to be rotated through a single tooth advance for each pulse. To reduce the lag in resumption of rotation as far as possible, it is preferred that the gears and wheels be made of some very light, though wear-resistant, material, such as molded nylon.

To utilize the rotation of the escapement wheel 11, thus synchronized with the pulses received by the escapement coil 46 in a pulse counting operation, a cam-actuated switching mechanism is provided. Two switch push bars 49 and 50 are disposed below the escapement wheel 11 and cam wheel 18, respectively, the push bars being urged upwardly into contact with the wheels 11 and 18. The escapement wheel 11 is provided with a cam projection 51 adapted to force the push bar 49 downwardly as the cam projection rides over the upper end of the push bar 49. The cam wheel 18 is also provided with a cam surface 52 adapted to force the push bar 50 downwardly as this cam surface rides over the upper end of the push bar 50. As will be noted from an inspection of Fig. 1, for each full rotation of the escapement wheel 11, each push bar 49 and 50 will be forced downwardly one time. The escapement wheel 11 is shown in Fig. 1 as being in the zero position, and on the ninth pulse the push bar 50 will be actuated, and on the tenth pulse the push bar 49 will be actuated. Since the push bar 50 is actuated on the ninth pulse, it may be referred to as the 9-push bar, and, similarly, the push bar 49 may be referred to as the 10-push bar.

It is also desirable, in various applications of the pulse counter 10, that once the 10-push bar 49 has been moved downwardly, it should be latched against movement in an upward direction. Such latching is brought about by means of the latch bar 53 pivoted at 54, having a relatively horizontal end piece 55 adapted to hook over the projection 56 extending transversely of the 10-push bar 49 by urging of spring 57. As the 10-push bar moves downwardly, the projection 56 will also move downwardly, allowing the end piece of the latch bar 53 to move in a clockwise direction, the spring 57 retaining the latch bar in engagement with the horizontal projection 56 until such time as the latch bar is returned to its position as shown in Fig. 1. It will be noted that the cam projection 51 on the escapement wheel has an abrupt face 58, allowing the 10-push bar to return from its latched position to its normal upward position after unlatching, even though the escaptment wheel is at rest.

An electromagnet 59, which may be called the unlatch coil, is mounted on the unit supporting plate 15, with its pole piece 60 in attracting relation to the latch bar 53. As the unlatch coil is energized, the latch will pivot in a counterclockwise direction around 54 and the latch bar end will move out of engagemtnt with the 10-push bar projection 56, thus allowing the 10-push bar to return to its normal upper position.

To illustrate the functioning of the push bars 49 and 50, let it be assumed that the pulse counter is in the position shown in Fig. 1, and that pulses are being applied to the escapement coil 46. The first 8 pulses will cause the escapement wheel to rotate an amount equivalent to 8 escapement teeth. The push bars 49 and 50 will not be operated during these pulses. If one more pulse is applied to the escapement coil, the escapement wheel will rotate an amount equal to one tooth and the cam projection 52 on the cam wheel 18 will force the 9-push bar 50 downwardly, and will hold the 9-push bar in a downward position until another pulse is applied to the escapement coil. As the next pulse is applied, the escapement wheel will again rotate, and the cam projection will move from its position holding the 9-push bar downwardly, and the 9-push bar will thus be allowed to return to its upward position. At the same time, the cam surface 51 will engage the 10-push bar 49, causing it to move downwardly, where it is latched by the latch bar 53. The escapement wheel comes to a rest at the end of the tenth pulse with the cam surface 51 out of engagement with the 10-push bar. With the escapement wheel at rest in its present position, a pulse may be applied to the unlatch coil, allowing the 10-push bar to move upwardly to its normal upward position.

As will be further seen in Fig. 1, the cam 18 is angularly related to the escapement wheel 11 so that the cam projection 52 will move the 9-push bar 50 downwardly after the escapement wheel is released for rotation by the ninth pulse, with the downward movement being completed before the escapement wheel moves through a single tooth advance. Similarly the cam projection 52 will allow the 9-push bar to be moved upwardly after the escapement wheel is released for rotation by the tenth pulse, such upward movement being completed before the escapement wheel advances through a single tooth rotation. In the same manner, the 10-push bar is moved downwardly to latched position after the tenth pulse has released the escapement wheel for rotation and before the wheel turns through a single tooth advance. The delay in time between the release of the escapement wheel by a pulse and the actuation of the 9- and 10-push bars in response to the rotation of the escapement wheel is sufficiently long as to have the push bar movement occur after the pulse energizing the escapement coil 46 has ended, for a purpose to be more fully described hereinafter.

Figure 7:
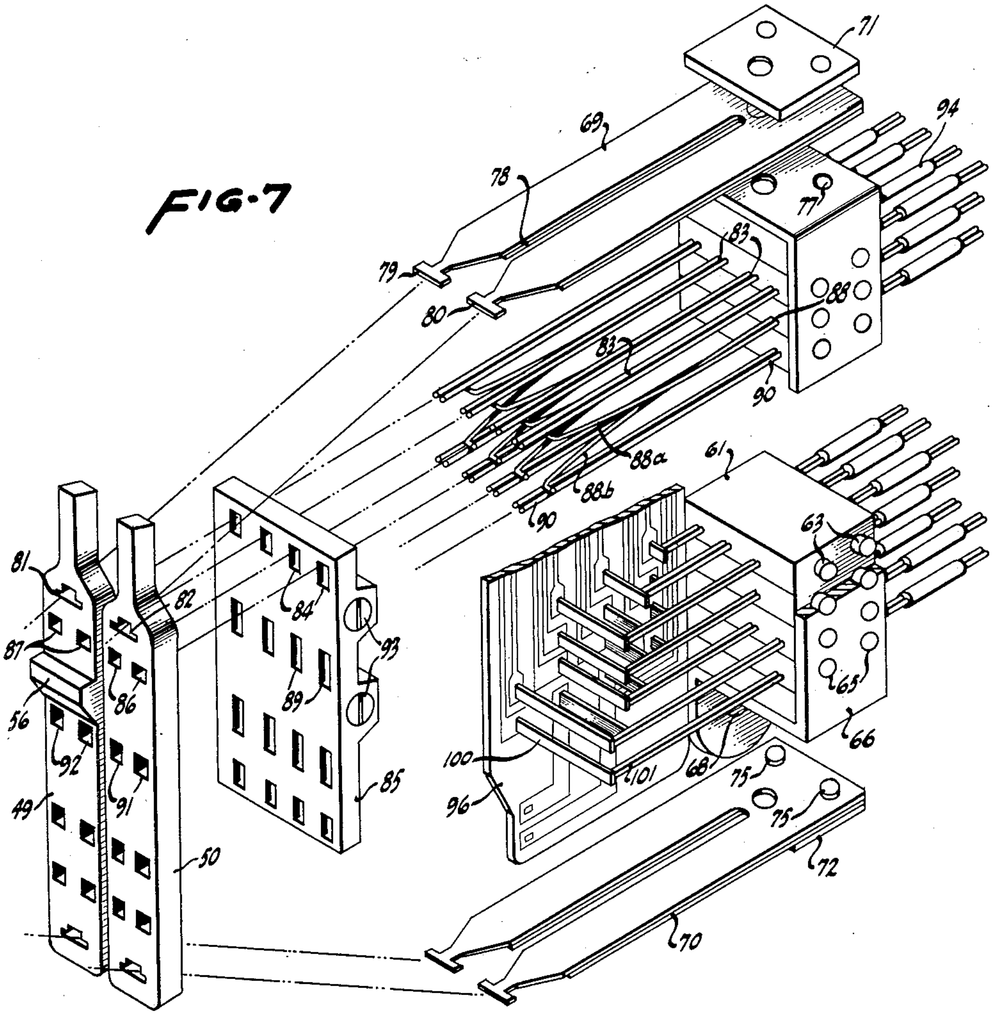
Fig. 7 is an exploded, isometric view of the switch mechanism of the pulse counter.

The longitudinal movement of the push bars 49 and 50 is used to effect switching operations by means to be now described. Fig. 7 shows an exploded view of the switching assemblage, and comprises a plurality of insulating terminal blocks 61 having groups of paired wires 62 extending therethrough. The blocks 61 have raised lugs 63 on either end adapted to fit within holes 64 formed in the unit supporting plate 15 and within holes 65 formed in the terminal block bracket 66. As is evident, the terminal blocks are built up with the desired number and are clamped to the unit supporting plate 15 by means of bolts 67 extending through holes 68 formed in the ends of bracket 66. Leaf springs 69 and 70 are fixed to the upper and lower ends of the bracket 66 by means of top and bottom face plates 71 and 72 and cap screws 73 and 74. Each face plate 71 and 72 is provided with a pair of bosses 75 adapted to align the holes 76 formed in the leaf springs and holes 77 formed in the bracket 66. The upper leaf spring 69 is bifurcated by slot 78, and the free ends 79 and 80 of the leaf spring are adapted to fit within the keyhole-shaped openings 81 and 82 formed in the upper ends of push bars 49 and 50, respectively. The lower leaf spring 70 is similarly attached to the lower ends of push bars 49 and 50. The upper and lower leaf springs 69 and 70 bias the push bars towards their upper position in contact with the escapement wheel 11 and cam wheel 18, respectively.

As shown in Figs. 1 and 7, the upper three terminal blocks 61 each has four sets of double wires extending therethrough. The top sets of wire 83 extend from the top terminal block 61 through the openings 84 in the insulated support block 85 and into the openings 86 of the 9-push bar 50 and openings 87 of the 10-push bar 49. The middle sets of wire 88 are split so that the one wire 88*a* is received in the openings 84 of support block 85, and the other wire 88*b* is received in the openings 89 of support block 85. The lower sets of wires 90 extend from the terminal block 61 through the openings 89 of the support block 85 and are received in the openings 91 of the 9-push bar and openings 92 of the 10-push bar. The wires 88*a* and 88*b* are bent at right angles at their free ends so that when in position in support block 85, they will provide optimum contact with either the wires 83 or 90. Bolts 93 secure the support block 85 to the unit supporting plate 15.

As is best seen in Fig. 1, when the push bars 49 and 50 are in their normal upper position, the wires 90 will be in contact with the wires 88*b* to complete an electrical circuit therethrough. When either push bar is depressed, the circuit between wires 90 and 88*b* will be broken and a circuit will be completed by the contact of wires 83 with wires 88*a*.

Figures 2, 3, 4, 5, 6:
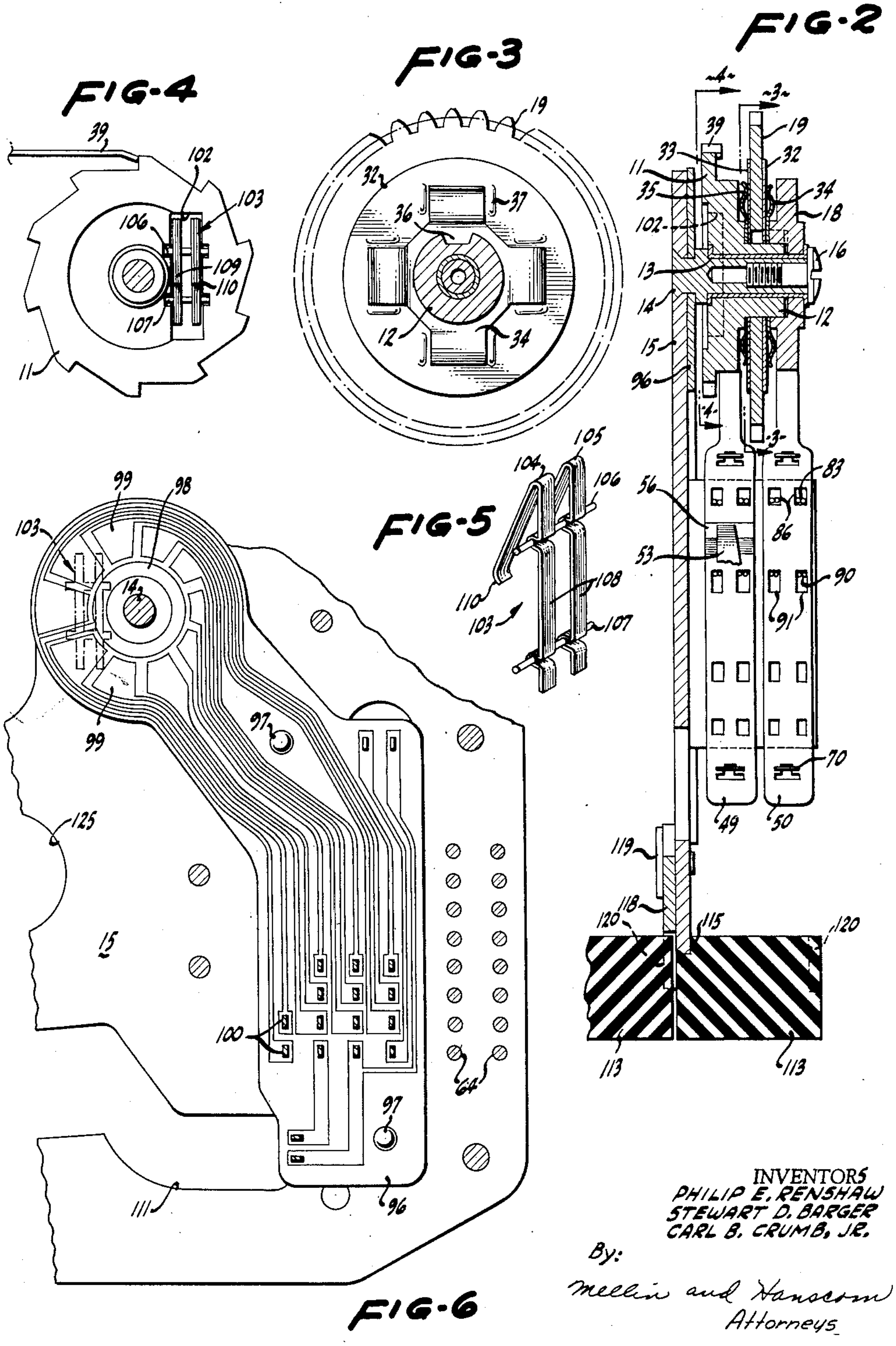
Fig. 2 is a sectional view of the pulse counter with parts shown in elevation, taken on line 2—2 of Fig. 1.
Fig. 3 is a sectional view of the pulse counter as taken on line 3—3 of Fig. 2.
Fig. 4 is a sectional view of the pulse counter as taken on the line 4—4 of Fig. 2.
Fig. 5 is an isometric view of the pulse counter static read-out brush.
Fig. 6 is a front elevational view of the pulse counter support, with the pulse counting and switch mechanism removed, to show the details of the static read-out circuits.

All of the wires thus far mentioned extend through the terminal blocks 61 to the right, as viewed in Figs. 1 and 6, and are encompassed by electrically conducting terminals 94, adapted to be received within jacks 95 to connect the wires to the different circuits in the computer unit.

The pulse counter 10 is also adapted to provide a static read out of the relative rotational positions of the escapement wheel. As has been explained, for each pulse applied to the escapement coil 46, the escapement wheel 11 will advance one tooth, or, that is, through 36 degrees. A printed circuit, as shown in Fig. 12, is used to convert the relative angular position of the escapement wheel 11 into decimal information. A non-conductive plate 96 is fastened to the unit supporting plate 15 by means of rivets 97 and has a printed circuit formed thereon in the usual manner, comprising a central annular contact ring 98 and ten segmented contact areas 99 spaced circumferentially of the contact ring. All of the contacts 99 and the ring 98 are connected electrically by printed circuits to the lower end of the plate 96 and then by means of lugs 100 to wires 101 extending through terminal blocks 61 to the terminals 94. Thus, for each contact area 99 and the ring 98 there is a corresponding terminal 94 on the right side of the terminal blocks 61.

Mounted in a recess 102 formed in the escapement wheel 11 is the static read-out brush 103, illustrated in detail in Fig. 5. The brush comprises two sets of parallel wires 104 and 105, each mounted on and soldered to shafts 106 and 107. The straight portion 108 of the brush 103 is adapted to lie within the recess 102 and the reversely curved portions 109 are adapted to ride over the ring 98 and the segmented areas 99, so that for any angular position of the escapement wheel, a circuit will be complete from the ring 98, through the portion 109 of the brush in contact with the ring, through the brush to the other portion 110 and to the particular segmented area 99 with which that brush portion is then in contact.

The escapement coil 46 and unlatch coil 59 are also wired by means of printed circuits to the contacts on the rear of the terminal block 61 in a manner similar to the static read-out circuits. The plate 96 is provided with a cut-out portion 111 to allow room for the unlatch coil leads 112 to be disposed between the unlatch coil and the unit supporting plate 15.

The pulse counters 10, when used, are adapted to be mounted in plastic mounting frames 113 provided with a top recess 114 adapted to receive the top rear corner of the unit supporting plate 15, and a bottom recess 115 adapted to receive the bottom edge of the unit supporting plate 15. The rear of the mounting frame has a series of holes 116 formed therethrough adapted to register with the terminals 94 of the pulse counter, so that when the pulse counter is mounted in the mounting frame, the terminals 94 will extend through the holes 116 and occupy a recess 117 formed in the rear mounting frame. After the pulse counter is in place, the jacks 95 are connected to the terminals.

A locking lever 118, pivoted at bolt 119, is utilized to hold the pulse counter in assembled relation with the mounting frame 113. The frame has a triangular notch 120 formed therein to cooperate with a depending triangular portion 121 of the locking lever 118. As the handle portion 122 of the locking lever is moved downwardly, the triangular lever portion 121 will enter the notch 120 to lock the pulse counter against outward movement relative to the mounting frame 113. To remove the pulse counter from the mounting frame, the handle portion of the locking lever is moved upwardly. The rear end 123 of the locking lever will engage the cam surface 124 of the mounting frame, and the pulse counter will be urged outwardly therefrom. A finger hole 125 is provided in the unit supporting plate 15 to provide additional means to pull the pulse counter from the mounting frame.

Figure 9:
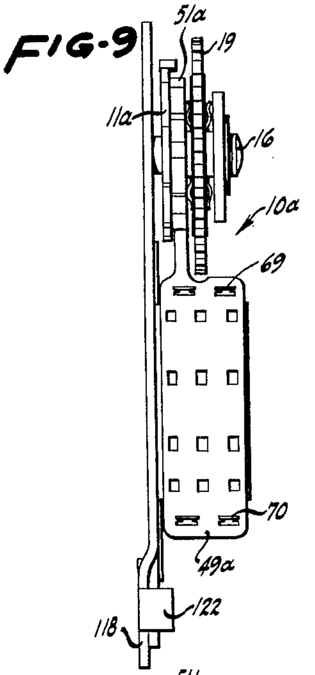
Fig. 9 is a side elevational view of the pulse relay of Fig. 8.
Figure 8:
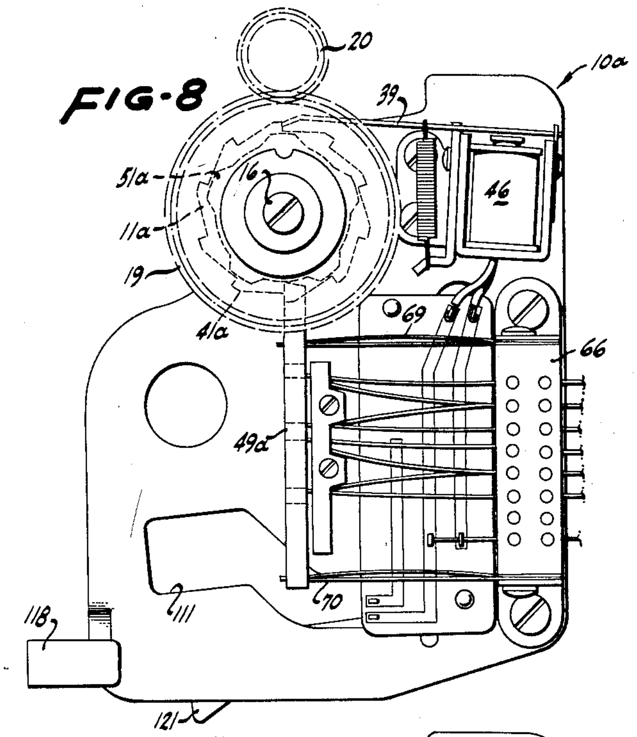
Fig. 8 is a front elevational view of a pulse relay embodying the invention.

Figs. 8 and 9 illustrate a modification of the pulse counter mechanism as modified to provide a relay means, and indicated generally at 10*a*. The arrangement of parts is generally the same as the pulse counter 10, with modified parts being designated by like reference numerals, with the letter "*a*" applied thereto. The escapement wheel 11*a* is again provided with ten escapement teeth 41*a*, but is now provided with five cam lobes 51*a*, spaced equidistantly around the escapement wheel. A single push bar 49*a* is provided, with the upper end thereof being held in engagement with the escapement wheel. As successive pulses are applied to the escapement coil 46, the escapement wheel 11*a* will rotate, as explained above. After every odd pulse, the cam projection 51*a* will force the push bar 49*a* downwardly, and after every even pulse, the push bar will be moved upwardly by the leaf springs 69 and 70, so that as the escapement wheel 11*a* rotates, the push bar 49*a* will move alternatively downwardly and upwardly. Again, the upward or downward movement of the push bar will occur after the escapement wheel is released for rotation by an energization of the escapement coil and before the escapement wheel moves through a single tooth advance. The movement of the push bar 49*a* effects a switching action as has been explained in connection with the pulse counter 10.

In the use of the pulse counter and relays described herein, the switches thereof are preferably utilized to control circuits energized by the same pulses as are used to energize the escapement coils.

Figure 13:
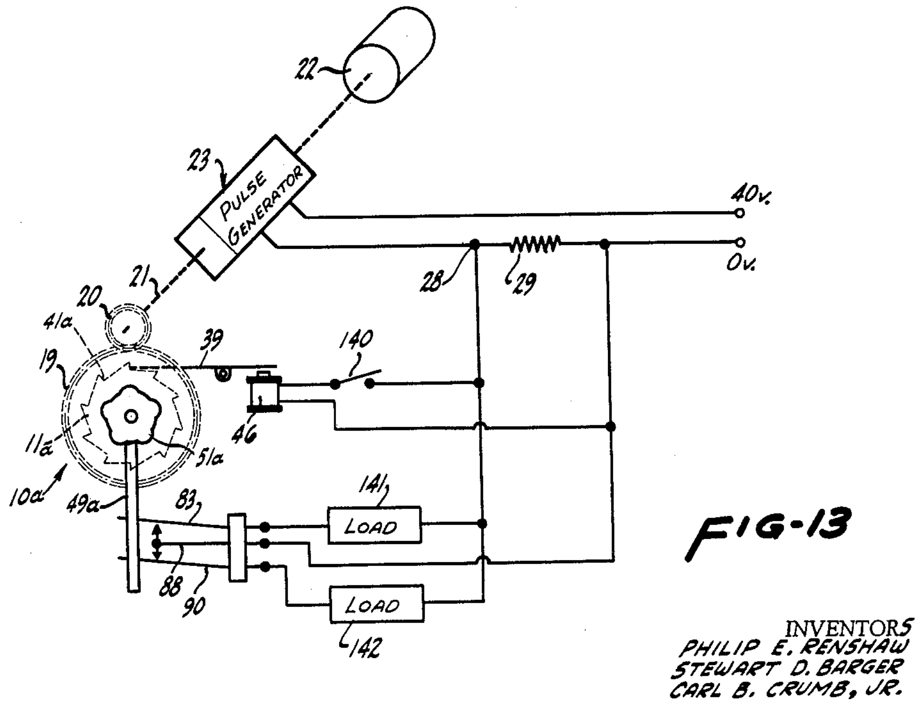
Fig. 13 is a view similar to Fig. 12 illustrating the pulse relay of Figs. 8 and 9.

Fig. 13 illustrates the manner in which the relay 10*a* is connected with the pulse generator 23 in a control circuit. The output terminal 28 of the pulse generator is connected through a control switch 140 to the escapement coil 46. A first control circuit is made from the output terminal 28, through the open switch 83—88 of the relay and a load, generally designated at 141; and a second control circuit is made from the output terminal 28 through the closed switch 90—88 of the relay to the load 142.

With the relay connected mechanically and electrically as shown in Fig. 13, the pinion gear 20 and the main drive gear 19 will be continuously rotating, and a series of pulses will be generated by the pulse generator 23, these pulses being applied to the load 142. If the switch 140 is now closed to allow a single pulse to pass therethrough, the escapement coil will be energized to move the pallet lever out of rotation restraining engagement with the escapement tooth 41*a*, allowing the escapement wheel to rotate through a one-tooth advance, as before described. At the same time, the pulse will also be applied to load 142. The rotation of the escapement wheel will then cause the cam projection 51*a* to move the push bar, or cam follower, 49*a* downwardly to close switch 83—88 and to open switch 90—88. An important aspect of the invention is that the cam projections 51*a* are arranged relative to the escapement teeth 41*a* so that the switching operation does not occur until after the pulse has ended and before the escapement wheel has rotated through a single tooth advance. Thus, the switching operation takes place when the circuits are deenergized, and there can be no possibility of arcing at the points of the switches.

The succeeding pulses will now be applied to load 141 until the control switch 140 is again closed to allow a pulse to energize the escapement coil, allowing the escapement wheel to rotate through a single tooth advance, to return the push bar to its position shown in Fig. 13. Again, the switching of switches 83—88 and 90—88 is delayed until after the circuits controlled thereby are deenergized.

If switch 140 were left closed, the escapement wheel would be allowed to turn continuously, causing the loads 141 and 142 to be alternately energized by consecutive pulses. However, the switching of these circuits would still occur only when the circuits are deenergized.

Figure 11:
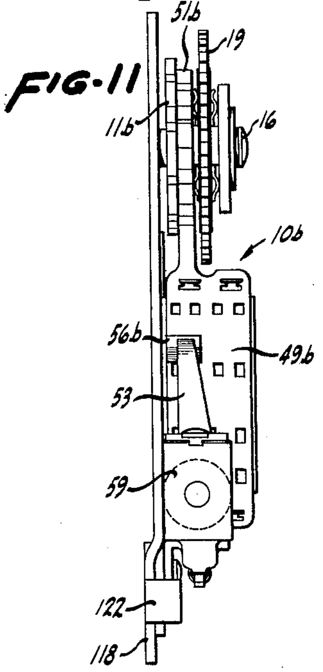
Fig. 11 is a side elevational view of the modified pulse relay of Fig. 10.
Figure 10:
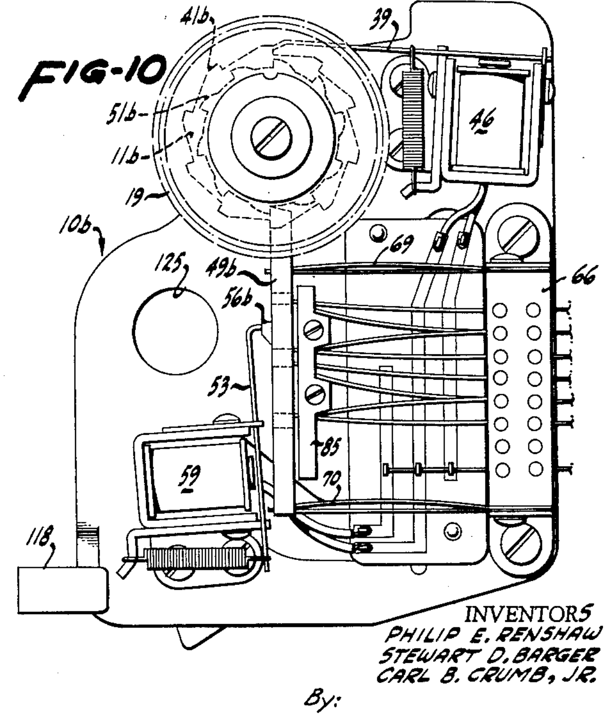
Fig. 10 is a front elevational view of a modified pulse relay embodying the invention.

Another form of the invention is illustrated in Figs. 10 and 11. The relay, indicated generally by the reference numeral 10*b*, is similar in design to relay 10*a* shown in Figs. 8 and 9. The escapement wheel 11*b* again has ten escapement teeth 41*b*, but there are ten cam lobes 51*b* formed thereon, so that the push bar 49*b* will be moved downwardly each time the escapement wheel rotates through a one-tooth advance. As will be noted in Fig. 10, the cam lobes 51*b* are so related to the escapement teeth that when a tooth 41*b* is in engagement with the pallet lever 39, the push bar 49*b* is in its upper position. As the wheel 11*b* moves through a single tooth advance, a cam lobe 51*b* will force the push bar downwardly. When the next tooth comes into engagement with the pallet lever 39 to stop the rotation of the wheel, the cam lobe 51*b* will have moved past the push bar to enable the push bar to return to its normal upper position, when unlatched, without requiring further movement of the escapement wheel.

Figure 14:
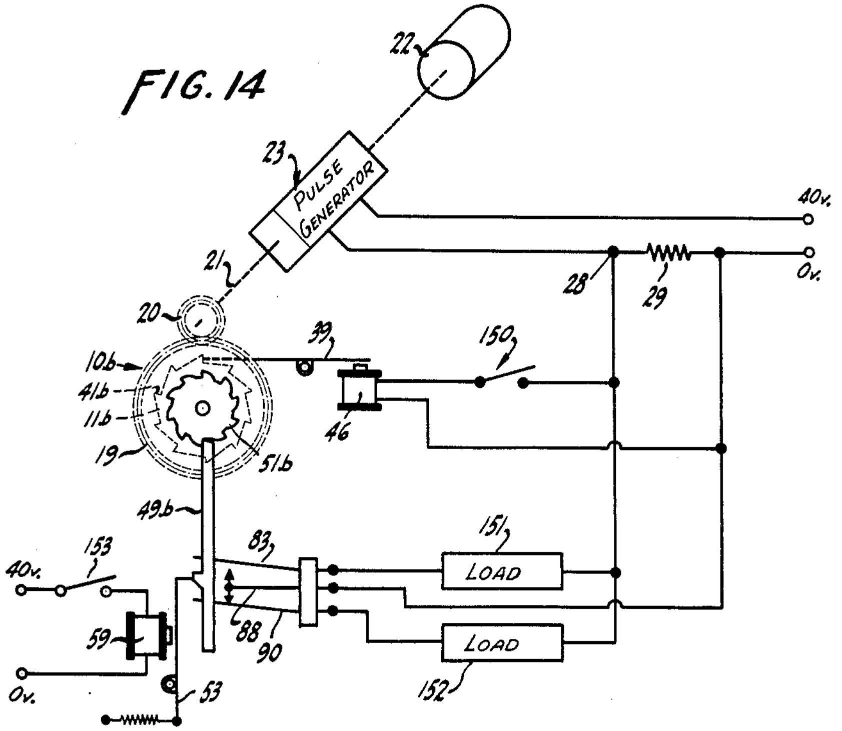
Fig. 14 is a view similar to Fig. 12 illustrating the modified pulse relay of Figs. 10 and 11.

Fig. 14 illustrates the manner in which the relay modifications of Figs. 10 and 11 may be used. The electrical and mechanical connections are similar to that shown in Fig. 13, with a control switch 150 being used to connect the escapement coil **46*b* to the pulse generator output 18.**

An unlatch coil 59 and latch lever 53 have been added to this relay **10*b* to latch the push bar in its downward position. Thus, each time the push bar is moved downwardly during a single tooth rotation of the escapement wheel, the latch lever 53 will engage the horizontal projection 56 on the push bar to prevent its upward movement as the cam lobe 51*b*** moves out of engagement with the push bar. A pulse applied to the unlatch coil will then unlatch the push bar for its upward movement, as has been explained previously.

As may be appreciated, alternate energization of the escapement coil 46 and the unlatch coil 59 are required to move the push bar, and the switch elements carried thereby, in an alternate downward and upward movement. Thus, starting from the position illustrated in Figs. 10 and 14 with the push bar in its upper position, a pulse at the escapement coil 46 is required to start the rotation of the escapement wheel **11*b* and the downward movement of the push bar to its latched position at which time the pulse will be applied to load 151 rather than load 152. After having been latched in its lower position, the push bar can only move upwardly to its original position if a pulse or other voltage is then applied to the unlatch coil 59 by closing the control switch 153.**

This arrangement of switch operating electromagnets has a particular advantage. As has been explained, the energizing pulse applied to the escapement coil must be of a limited time duration, so that the pallet lever may be moved out of engagement with the escapement wheel to allow the latter to rotate, and so that the pallet lever may return to its original position before the escapement wheel has rotated through a one-tooth advance in order that the pallet lever may prevent further rotation of the escapement wheel. However, the return of the push bar to its upper position from its latched position does not require any further rotation of the escapement wheel, and therefore the time duration of the pulse applied to the unlatch coil can be of any length greater than that required to energize the unlatch coil. Furthermore, it is not necessary that the pinion gear 20 be rotating to drive the escapement wheel for a switching operation to be performed by unlatching the push bar for upward movement, and thus the relay may be used in instances where the power drive is discontinuous.

This modification also utilizes the principle of delayed switching after the escapement coil has been energized so as to avoid arcing at the switch contacts.

Fig. 12 further illustrates the manner in which the pulse counter 10 is electrically connected to the pulse generator to perform switching functions upon loads represented by 131 and 132. The switching operations are performed in the same manner as the relays described in connection with Figs. 13 and 14, and it is not thought necessary to redescribe such function with reference to Fig. 12. Moreover, the principle is the same, in that the switches are operated after the escapement coil energizing pulse has ended, and before the escapement coil has rotated through a single tooth advance.

In the same manner, the read-out brush 103 is in contact with the annular common electrical contact 98 and with one of the contacts 99 for each rotative position of the escapement wheel. In the rotation of the escapement wheel, the brush will be moved from contacting engagement with contact 99 after the pulse applied to the escapement coil has ended and will move its contacting engagement with the next contact 98 before the escapement wheel completes a one-tooth advance. In this manner the annular contact 98 and the contact 99 can be connected in series with the pulse generator 23 to gate the pulses to the particular contacts 98 bridged by the brush 103 and there will be no possibility of arcing at the contacts as the brush moves from one such contact to the next.

In the discussion of the operation of the pulse counters and relays, the pulse generator 23 has been described as being in synchronization with the rotation of the escapement wheel. However, another important advantage of the devices described is that such synchronization is not necessary for successful operation, and thus the pulse generator 23 may be disassociated from the power drive mechanism, if desired. The only requirements for the pulse generator is that the pulse length be sufficiently long so as to energize the escapement coils, and be sufficiently short so that the pulse will have ended before a switching operation occurs from the escapement coil energization. Also, the pulses should not occur at spaced time intervals less than that required for a single tooth advance.

With an unsynchronized pulse generator, each pulse will act on the pulse counter and pulse relays in the same manner as a single pulse from a synchronized pulse generator; that is, the escapement coil will be energized to release the escapement wheel for rotation, with the pallet lever returning to its original position, when the escapement coil is de-energized, to stop the wheel after a single tooth advance. The next unsynchronized pulse will again cause a single tooth advance of the escapement wheel. The only difference between a synchronized pulse source and an unsynchronized pulse source is the operation when a continuous series of pulses is applied to the escapement coil. If the series is synchronized to the escapement wheel rotation, the pallet lever will only engage the escapement wheel after the last pulse of the series, whereas if the pulse series is unsynchronized, the pallet lever will stop the rotation of the escapement wheel after each pulse of the series.

Figure 15:
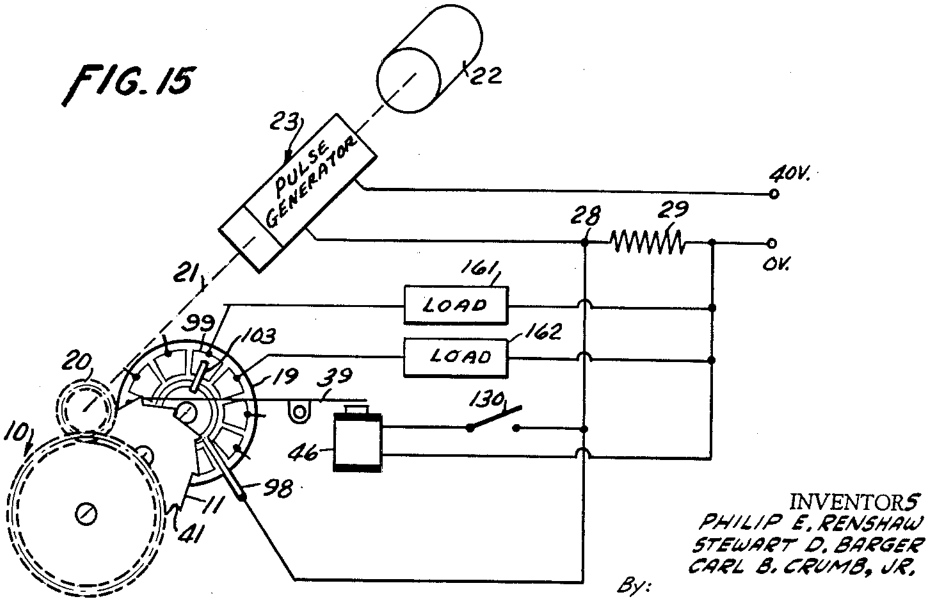
Fig. 15 is a view similar to Fig. 12 illustrating the electrical connections of the read-out circuit of the pulse counter.

Fig. 15 is similar to Fig. 12 and illustrates the manner in which the read-out contacts 98 and 99 are electrically connected with the pulse generator 23. The output terminal 28 of the pulse generator is electrically connected to the annular contact ring 98. Each contact 99 is electrically connected through suitable loads, indicated partially in Fig. 15 as 161 and 162 to the 0-volt terminal.

As shown in Fig. 15, all of the pulses generated by the pulse generator will be impressed upon load 161 because the read-out brush 103 is bridging the contact 99 connected thereto and the annular contact ring 98.

If switch 130 is now closed, the next pulse will energize the escapement coil 46 to allow the escapement wheel 11 to start rotating. The same pulse is also impressed on load 161. The brush 103 will move with the escapement wheel 11 as it rotates but will remain in electrical contact with contact 99 (connected to load 161) until the pulse is ended. The brush will then move out of contact with contact 99 (connected to load 161) and will move into contact with the contact 99 which is connected to load 162. If switch 130 is opened immediately following the above pulse, the pallet lever 39 will stop the escapement wheel after a single tooth advance with the brush 103 bridging between the annular contact ring 98 and the contact 99 connected to load 162. Thereafter, all of the pulses generated by the pulse generator 23 will be impressed upon load 162 until another pulse is applied to the coil 46.

Thus, the same pulse is applied to the contacts 98 and 99 as are applied to the coil 46. However, the brush 103 is moved from one contact 99 to another contact 99 only in the intervals between pulses. Therefore, the brush 103 never makes or breaks an energized circuit and thus eliminates failure of these contacts from arcing.

Having thus described our invention, what we claim and desire to secure by Letters Patent is:

1. Electric pulse relay mechanism comprising a movable member having a plurality of equally spaced escapement teeth thereon, electric pulse operated means engageable with said teeth to restrain movement of said movable member and operable when energized to release said movable member for movement thereof, said pulse operated means requiring an electric pulse of a discrete duration for the energization thereof, power drive means for moving said movable member when released, said power drive means being operable to move said movable member through a one tooth advance in a length of time greater than the pulse duration required to energize said pulse operated means, a switch, and switching mechanism operable by movement of said movable member to effect a switching operation of said switch member, said switching operation occurring after the length of time required to energize said pulse operated means and before the movable member has moved through a one tooth advance.

2. Electric pulse relay mechanism comprising a movable member having a plurality of equally spaced escapement teeth thereon, electric pulse operated means engageable with said teeth to restrain movement of said movable member and operable when energized to release said movable member for movement thereof, electric pulse generator means for producing an electric pulse of a discrete duration sufficient to energize said pulse operated means, said pulse generator means being electrically connected to said pulse operated means, power drive means for moving said movable member when released, said power drive means being operable to move said movable member through a one tooth advance in a length of time greater than the pulse duration, a switch, switching mechanism operable by movement of said movable member to effect a switching operation of said switch member, said switching operation occurring after the pulse produced by said pulse generator has ended and before the movable member has moved through a one tooth advance, and a circuit including said switch member and electrically energized by said pulse generator.

3. Electric pulse relay mechanism comprising a movable member having a plurality of equally spaced ratchet teeth thereon, electric pulse operated means engageable with said teeth to restrain movement of said movable member and operable when energized to release said movable member for movement thereof, electric pulse generator means for producing an electric pulse of a discrete duration sufficient to energize said pulse operated means, said pulse generator means being electrically connected to said pulse operated means, power drive means for moving said movable member when released, said power drive means being operable to move said movable member through a one tooth advance in a length of time greater than the pulse duration, a switch, switching mechanism operable by movement of said movable member to effect a switching operation of said switch member, said switching operation occurring after the pulse produced by said pulse generator has ended and before the movable member has moved through a one tooth advance, a circuit including said switch member and electrically energized by said pulse generator, and said pulse generator being further operable to produce a series of said discrete duration pulses in which the length of time between the beginning of successive pulses is equal to the length of time required for a one tooth advance of said movable member.

4. Electric pulse relay mechanism comprising an escapement wheel having a plurality of equally spaced escapement teeth thereon, a pallet lever engageable with said escapement teeth to restrain rotation of said wheel, electric pulse operated means operable when energized to move said pallet lever out of restraining engagement with said teeth, said pulse operated means requiring an electric pulse of discrete time duration for the energization thereof, an impositive, continuously rotatable drive mechanism operable to rotate said wheel when it is released for rotation by said pallet lever, said drive mechanism being operable to rotate said wheel through a one tooth advance thereof in a length of time greater than the time duration of said pulse, cam means rotatable with said ratchet wheel, a switch member, a cam follower engageable with and movable by said cam means and operable by rotation of said cam means to be moved to effect a switching operation of said switch member, said switching operation occurring after the time duration of said pulse required for the energization of said pulse operated means and before said escapement wheel has moved through a one tooth advance.

5. Electric pulse relay mechanism comprising an escapement wheel having a plurality of equally spaced escapement teeth thereon, a pallet lever engageable with said teeth to restrain rotation of said wheel, electric pulse operated means operable when energized to move said pallet lever out of restraining engagement with said teeth, electric pulse generator means electrically connected to said pulse operated means for producing an electric pulse of discrete time duration sufficient to energize said pulse operated means, an impositive, continuously rotatable drive mechanism operable to rotate said wheel when it is released for rotation by said pallet lever, cam means rotatable with said escapement wheel, a switch member, and a cam follower engageable with and movable by said cam means and operable by rotation of said cam means to be moved to effect a switching operation of said switch member, said switching operation occurring after said electric pulse has ended.

6. Electric pulse relay mechanism comprising an escapement wheel having a plurality of equally spaced escapement teeth thereon, a pallet lever engageable with said teeth to restrain rotation of said wheel, electric pulse operated means operable when energized to move said pallet lever out of restraining engagement with said teeth, electric pulse generator means electrically connected to said pulse operated means for producing an electric pulse of discrete time duration sufficient to energize said pulse operated means, an impositive, continuously rotatable drive mechanism operable to rotate said wheel when it is released for rotation by said pallet lever, said drive mechanism being operable to rotate said wheel through a one tooth advance thereof in a length of time greater than said pulse duration, cam means rotatable with said escapement wheel, a switch member, a cam follower engageable with and movable by said cam means and operable by rotation of said cam means to be moved to effect a switching operation of said switch member, said switching operation occurring after said electric pulse has ended and before said escapement wheel has moved through a one tooth advance, and a circuit including said switch member and electrically enerized by said pulse generator means.

7. Electric pulse relay mechanism comprising an escapement wheel having a plurality of equally spaced escapement teeth thereon, a pallet lever engageable with said teeth to restrain rotation of said wheel, electric pulse operated means operable when energized to move said pallet lever out of restraining engagement with said teeth, electric pulse generator means electrically connected to said pulse operated means for producing an electric pulse of discrete time duration sufficient to energize said pulse operated means, an impositive, continuously rotatable drive mechanism operable to rotate said wheel when it is released for rotation by said pallet lever, said drive mechanism being operable to rotate said wheel through a one tooth advance thereof in a length of time greater than said pulse duration, cam means rotatable with said escapement wheel, a switch member, a cam follower engageable with and movable by said cam means and operable by rotation of said cam means to be moved to effect a switching operation of said switch member, said switching operation occurring after said electric pulse has ended and before said escapement wheel has moved through a one tooth advance, and a circuit including said switch member and electrically energized by said pulse generator means, said pulse generator means being further operable to produce a series of said discrete duration pulses in which the length of time between the beginning of successive pulses is equal to the length of time required for a one tooth rotative advance of said escapement wheel.

8. A device of the character described comprising an escapement wheel having a plurality of equally spaced escapement teeth thereon, a pallet lever engageable with said ratchet teeth to restrain rotation of said wheel, electric pulse operated means operable when energized to move said pallet lever out of restraining engagement with said teeth, electric pulse generator means electrically connected to said pulse operated means for producing an electric pulse of discrete time duration sufficient to energize said pulse operated means, and an impositive, continuously rotatable drive mechanism operable to rotate said wheel when it is released for rotation by said pallet lever, said escapement wheel being free to rotate continuously with and by said drive mechanism when said pallet lever is held out of the path of said escapement teeth by energization of said electrical pulse operated means, said drive mechanism being operable to rotate said wheel through a one tooth advance thereof in a length of time greater than said pulse duration, said pulse generator means being further operable to produce a series of said discrete duration pulses in which the length of time between the generation of successive pulses is equal to the length of time required for a one tooth rotative advance of said escapement wheel.

9. Electric pulse relay mechanism comprising an escapement wheel having an escapement tooth thereon, pulse operated means engageable with said tooth to restrain rotation of said wheel and operable when energized to release said wheel for rotation, said pulse operated means requiring an electric pulse of discrete time duration for the energization thereof, a drive mechanism operable to rotate said wheel when it is released for rotation by said pulse operated means, cam means rotatable with said escapement wheel, a switch member, a cam follower engageable with and movable by said cam means and operable by rotation of said cam means to be moved to effect a switching operation of said switch member, the length of time between the release of said escapement wheel for rotation by energization of said pulse operated means and the occurrence of said switching operation being greater than the time required for energization of said pulse operated means, latch means operable to latch said cam follower when moved by said cam means, and electromagnet means operable when energized to actuate said latch means to release said cam follower for movement into engagement with said cam means.

10. Electric pulse relay mechanism comprising an escapement wheel having a plurality of equally spaced escapement teeth thereon, a pallet lever engageable with said teeth to restrain rotation of said wheel, electric pulse operated means operable when energized to move said pallet lever out of restraining engagement with said teeth, electric pulse generator means electrically connected to said pulse operated means for producing an electric pulse of discrete time duration sufficient to energize said pulse operated means, an impositive, continuously rotatable drive mechanism operable to rotate said wheel when it is released for rotation by said pallet lever, said drive mechanism being operable to rotate said wheel through a one tooth advance thereof in a length of time greater than said pulse duration, cam means rotatable with said escapement wheel, a switch member, a cam follower engageable with and movable by said cam means and operable by rotation of said cam means to be moved to effect a switching operation of said switch member, said switching operation occurring after said electric pulse has ended and before said escapement wheel has moved through a one tooth advance, latch means operable to latch said cam follower when moved by said cam means, electromagnet means operable when energized to actuate said latch means to release said cam follower for movement into engagement with said cam means, and a circuit including said switch member and electrically energized by said pulse generator means.

11. Electric pulse relay mechanism comprising an escapement wheel having an escapement tooth thereon, a pallet lever engageable with said tooth to restrain rotation of said wheel, electric pulse operated means operable when energized to move said pallet lever out of restraining engagement with said tooth, electric pulse generator means electrically connected to said pulse operated means for producing an electric pulse of discrete time duration sufficient to energize said pulse operated means, a drive mechanism operable to rotate said wheel when it is released for rotation by said pallet lever, cam means rotatable with said escapement wheel, a switch member, a cam follower engageable with and movable by said cam means and operable by rotation of said cam means to be moved to effect a switching operation of said switch member, said switching operation occurring after said electric pulse has ended, latch means operable to latch said cam follower when moved by said cam means, electromagnet means operable when energized to actuate said latch means to release said cam follower for movement into engagement with said cam means, and a circuit including said switch member and electrically energized by said pulse generator means.

12. Electric pulse relay mechanism comprising an escapement wheel having an escapement tooth thereon, pulse operated means engageable with said tooth to restrain rotation of said wheel and operable when energized to release said wheel for rotation, electric pulse generator means electrically connected to said pulse operated means for producing an electric pulse of discrete time duration sufficient to energize said pulse operated means, a drive mechanism operable to rotate said wheel when it is released for rotation by said pulse operated means, cam means rotatable with said wheel, a switch member, a cam follower engageable with and movable by said cam means and operable by rotation of said cam means to be moved to effect a switching operation of said switch member, said switching operation occurring after said electric pulse has ended, latch means operable to latch said cam follower when moved by said cam means, electromagnet means operable when energized to actuate said latch means to release said cam follower for movement into engagement with said cam means, and a circuit including said switch member and electrically energized by said pulse generator means.

13. Electric pulse relay mechanism comprising a rotatable escapement wheel having a plurality of equally spaced escapement teeth thereon, electric pulse operated means engageable with said teeth to restrain rotation of said wheel and operable when energized to release said wheel for rotation thereof, electric pulse generator means for producing an electric pulse of a discrete duration sufficient to energize said pulse operated means, said pulse generator means being electrically connected to said pulse operated means, power drive means for rotating said wheel when released, said power drive means being operable to rotate said movable member through a one tooth advance in a length of time greater than the pulse duration, a switch, switching mechanism operable by rotation of said wheel to effect a switching operation of said switch member, said switching operation occurring after the pulse produced by said pulse generator has ended and before the wheel has rotated through a one tooth advance, and a circuit including said switch member and electrically energized by said pulse generator, said pulse generator being further operable to produce a series of said discrete duration pulses equally spaced in time an amount equal to the length of time required for a one tooth rotative advance of said wheel.

14. Electric pulse counter mechanism conprising a rotatable escapement wheel having a plurality of equally spaced escapement teeth thereon, electric pulse operated means engageable with said teeth to restrain rotation of said wheel and operable when energized to release said wheel for rotation thereof when energized by an electric pulse of a discrete duration, power drive means for rotating said wheel when released, said power drive means being operable to rotate said movable member through a one tooth advance in a length of time greater than the pulse duration required to energize said pulse operated means, an annular electrical contact concentric with the axis of said escapement wheel, a plurality of electrical contacts spaced around said axis, there being one electrical contact for each of said plurality of escapement teeth, a brush carried by said escapement wheel and engageable with said annular contact and with one of said plurality of contacts when said escapement wheel is rotatively positioned to be engaged by said pulse operated means, said brush being moved by said escapement wheel from engagement with said one contact after the pulse has ended and into engagement with the next of said plurality of contacts before the escapement wheel moves through a one tooth rotative advance.

15. Electric pulse counter mechanism comprising a rotatable escapement wheel having a plurality of equally spaced escapement teeth thereon, electric pulse operated means engageable with said teeth to restrain rotation of said wheel and operable when energized to release said wheel for rotation thereof, electric pulse generator means for producing an electric pulse of a discrete duration sufficient to energize said pulse operated means, said pulse generator means being electrically connected to said pulse operated means, power drive means for rotating said wheel when released, said power drive means being operable to rotate said movable member through a one tooth advance in a length of time greater than the pulse duration, an annular electrical contact concentric with the axis of said escapement wheel, a plurality of electrical contacts spaced around said axis, there being one electrical contact for each of said plurality of escapement teeth, a brush carried by said escapement wheel and engageable with said annular contact and with one of said plurality of contacts when said escapement wheel is rotatively positioned to be engaged by said pulse operated means, said brush being moved by said escapement wheel from engagement with said one contact after the pulse produced by said pulse generator has ended and into engagement with the next of said plurality of contacts before the escapement wheel moves through a one tooth rotative advance, and a circuit including said one contact and said annular contact and electrically energized by said pulse generator, said pulse generator being further operable to produce a series of said discrete duration pulses in which the length of time between the beginning of successive pulses is equal to the length of time required for a one tooth rotative advance of said wheel.

16. Electric pulse counter mechanism comprising a rotatable escapement wheel having a plurality of equally spaced escapement teeth thereon, electric pulse operated means engageable with said teeth to restrain rotation of said wheel and operable when energized to release said wheel for rotation thereof, electric pulse generator means for producing an electric pulse of a discrete duration sufficient to energize said pulse operated means, said pulse generator means being electrically connected to said pulse operated means, power drive means for rotating said wheel when released, said power drive means being operable to rotate said movable member through a one tooth advance in a length of time greater than the pulse duration, an annular electrical contact concentric with the axis of said escapement wheel, a plurality of electrical contacts spaced around said axis, there being one electrical contact for each of said plurality of escapement teeth, a brush carried by said escapement wheel and engageable with said annular contact and with one of said plurality of contacts when said escapement wheel is rotatively positioned to be engaged by said pulse operated means, said brush being moved by said escapement wheel from engagement with said one contact after the pulse produced by said pulse generator has ended and into engagement with the next of said plurality of contacts before the escapement wheel moves through a one tooth rotative advance and a circuit including said one contact and said annular contact and electrically energized by said pulse generator means.

17. Electric pulse counter mechanism comprising a ratchet wheel, electric pulse operated means operable to effect rotation of said ratchet wheel, cam means moved conjointly with said ratchet wheel, a cam follower engageable with said cam means and displaceable thereby, switching mechanism operable by displacement of said cam follower effected by said cam means to effect a switching operation, latch means operable to maintain said cam follower displaced for movement of said cam means out of engagement therewith after such displacement of said cam follower by said cam means, and electromagnet means operable to actuate the latch means for releasing the cam follower for movement into engagement with the cam means again.

18. Electric pulse counter mechanism comprising a ratchet wheel, electric pulse operated means operable to effect rotation of said ratchet wheel, a cam wheel rotated conjointly with said ratchet wheel, a cam follower engageable with said cam wheel, a resilient arm supported in cantilever fashion, supporting said cam follower and urging it into engagement with said cam wheel, switching mechanism operable by displacement of said cam follower effected by said cam wheel to effect a switching operation, a latch arm engageable with said cam follower to maintain it displaced for movement of said cam wheel out of engagement therewith after displacement of said cam follower by said cam wheel, and electromagnetic means operable to retract said latch means from engagement with said cam follower, enabling said resilient arm to move said cam follower into engagement with said cam wheel again.

References Cited in the file of this patent

UNITED STATES PATENTS

| | | |
|---|---|---|
| 1,455,763 | Werner | May 15, 1923 |
| 1,577,944 | Reisbach | Oct. 20, 1925 |
| 2,172,328 | Bryce | Sept. 5, 1939 |
| 2,700,076 | Good | Jan. 18, 1955 |
| 2,770,416 | Hopkins | Nov. 13, 1956 |
| 2,796,830 | Hilton | June 25, 1957 |